(12) United States Patent
Blalock

(10) Patent No.: US 8,124,320 B2
(45) Date of Patent: Feb. 28, 2012

(54) METHOD AND APPARATUS FOR SURFACE TENSION CONTROL IN ADVANCED PHOTOLITHOGRAPHY

(75) Inventor: Guy T. Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 979 days.

(21) Appl. No.: 11/302,293

(22) Filed: Dec. 13, 2005

(65) Prior Publication Data

US 2007/0131247 A1 Jun. 14, 2007

(51) Int. Cl.
*G03F 7/00* (2006.01)
*G03F 7/26* (2006.01)
*G03F 7/40* (2006.01)

(52) U.S. Cl. .................. 430/311; 430/331; 430/322
(58) Field of Classification Search .................. 430/311, 430/331
See application file for complete search history.

(56) References Cited

U.S. PATENT DOCUMENTS 4,984,597 A 1/1991 McConnell et al.
(Continued)

*Primary Examiner* — Amanda C. Walke
(74) *Attorney, Agent, or Firm* — TraskBritt

(57) ABSTRACT

A method and apparatus are used for cleaning and drying a semiconductor wafer. Within a sealable chamber, a wafer having photoresist features thereon is spun while a cleaning fluid is applied to a top surface of the semiconductor wafer to clean off excess photoresist. A rinsing solution is applied to rinse the semiconductor wafer of any remaining impurities. To reduce stresses on the photoresist features caused by surface tension of the rinsing solution as it dries, which stresses may cause toppling of the features, the semiconductor wafer is dried in a vapor ambient within the sealable chamber. The vapor ambient, formed by combining an inert gas with a vaporized surface tension modifying fluid, produces a Marangoni effect to reduce surface tension of the rinsing solution. Optionally, to further reduce surface tension, a surfactant may be introduced into the rinsing solution and the temperature and pressure of the interior of the sealed chamber may be adjusted.

20 Claims, 3 Drawing Sheets

U.S. PATENT DOCUMENTS

| | | | |
|---|---|---|---|
| 5,164,286 A * | 11/1992 | Blakeney et al. | 430/331 |
| 5,653,045 A | 8/1997 | Ferrell | |
| 5,882,433 A | 3/1999 | Ueno | |
| 5,911,836 A | 6/1999 | Hada et al. | |
| 6,050,275 A | 4/2000 | Kamikawa et al. | |
| 6,286,524 B1 | 9/2001 | Okuchi et al. | |
| 6,319,884 B2 | 11/2001 | Leduc et al. | |
| 6,430,840 B1 | 8/2002 | Jung | |
| 6,440,326 B1 | 8/2002 | Maruyama et al. | |
| 6,482,750 B2 | 11/2002 | Yokoi | |
| 6,562,146 B1 | 5/2003 | DeYoung et al. | |
| 6,582,891 B1 * | 6/2003 | Hallock et al. | 430/330 |
| 6,613,156 B2 | 9/2003 | Chang et al. | |
| 6,615,510 B2 | 9/2003 | Jones et al. | |
| 6,622,737 B2 | 9/2003 | Curtis et al. | |
| 6,709,807 B2 * | 3/2004 | Hallock et al. | 430/322 |
| 2002/0032973 A1 | 3/2002 | Jung | |
| 2004/0198066 A1 * | 10/2004 | Verhaverbeke | 438/745 |
| 2004/0224865 A1 * | 11/2004 | Roeder et al. | 510/175 |
| 2006/0088791 A1 * | 4/2006 | Harumoto et al. | 430/325 |

* cited by examiner

METHOD AND APPARATUS FOR SURFACE TENSION CONTROL IN ADVANCED PHOTOLITHOGRAPHY

BACKGROUND OF THE INVENTION

1. Field of the Invention

The present invention relates generally to cleaning semiconductor wafers. More particularly, it relates to cleaning, rinsing, and drying semiconductor wafers after a photolithography process.

2. State of the Art

Processing a semiconductor wafer to fabricate semiconductor devices thereon includes numerous steps to form multiple material layers on the wafer surface. One of the most critical and repeated process sequences in semiconductor device fabrication is photolithography. The photolithography process begins with application of a photoresist material upon a semiconductor wafer, typically using a process such as spin coating. The photoresist layer is then exposed to an activating radiation source through a photomask comprising a desired, repetitive pattern of features for the semiconductor devices being fabricated. The photomask pattern prevents the activating radiation from striking some areas of the semiconductor wafer and allowing the radiation through to strike other areas. Exposure of the photoresist by the activating radiation creates a photo-induced chemical transformation in the exposed areas of the photoresist.

Photoresists, also termed "resists" in the art, can be either positive acting or negative acting. With a positive acting resist, the use of which is much more prominent in modern photolithography techniques, the portions exposed to the radiation are rendered more soluble to a developer solution. By applying the developer solution after exposure, the exposed areas of the resist are removed, revealing the underlying surface of the wafer for further processing steps such as ion implantation, material deposition, or etching. After developing, but before moving on to these subsequent processing steps, it is critical to thoroughly clean, rinse, and dry the semiconductor wafer. This photolithography process is typically repeated numerous times to create the various layers involved fabricating semiconductor devices on a wafer. In a negative acting photoresist, portions thereof that are exposed to radiation are those that remain on the wafer to mask portions thereof after processing with a developer solution. However, exposure, development, cleaning, rinsing, and drying of the negative photoresist is effected in a manner similar to that for a positive photoresist.

As semiconductor geometries shrink, the photolithography process has evolved to accommodate smaller semiconductor device feature sizes. Conventionally, photoresist exposure has been accomplished with ultraviolet (UV) radiation. However, as feature sizes approach the wavelength of the exposure radiation, the use of alternative, shorter wavelength light such as deep UV, as well as other types of radiation beams, has been required. As the type of radiation changes, the photoresist composition must change such that it is sensitive to the new radiation wavelengths. Such composition changes may result in a photoresist that is more brittle.

Additionally, as semiconductor device feature sizes continue to shrink, the thickness at which the photoresist can be applied to the wafer has not shrunk proportionally. As a result, after developing and cleaning of a wafer, the photoresist features remaining on the wafer have an increased, or higher, aspect ratio, exhibiting heights that are substantially greater than widths. These types of feature configurations create an enhanced susceptibility to a phenomenon known as "toppling," which has been manifested to an unacceptable degree in minimum line-space pattern 248 nm and 193 nm photolithography. Lateral stresses placed on a tall photoresist feature comprising, for example, a line can cause the feature to break near the base of the line and topple over. Toppling thus moves the location of the photoresist feature and covers a portion of the semiconductor wafer that was not intended to be covered such that a future processing step such as material deposition will not occur where desired. Additionally, the toppled photoresist feature may break off completely from the desired location and float to a different location on the wafer, causing further processing errors. Unfortunately, one of the most serious sources of stress that can act on these high aspect ratio photoresist features is surface tension of a drying rinsing solution used to clean the wafer of developer solution, during spin out of a wafer. As the rinsing solution dries, the surface tension thereof between adjacent high aspect ratio features such as lines tends create a shear stress which induces a break between the photoresist and substrate (semiconductor wafer) at the resist/substrate interface, pulling the features over.

It has been discovered that surfactants may be used to help reduce surface tension of a rinsing solution. However, while this is effective to reduce toppling, long chain molecule surfactants (which appear to be more effective in reducing surface tension) may be harmful to subsequent etch processes and can leave a residue on the photoresist material as the rinsing solution dries, while short chain molecule surfactants may cause unwanted etching of the photoresist. As a result, while surfactants may be used in conjunction with the present invention, surfactants alone are not sufficient to address the surface tension and toppling problem attendant to the drying process.

A technique employing the well-known Marangoni effect is used in rinsing and drying processes to remove, or "rip" particles from the semiconductor wafer. The Marangoni effect manifests itself because a liquid of a lower surface tension is attracted by a liquid of a higher surface tension. However, in these conventional techniques, the Marangoni effect is used to displace the rinsing solution and replace it with the lower surface tension liquid. In effect, it forces the rinsing solution off the surface being cleaned so that only the lower surface tension liquid remains on the surface. The reason for performing this operation has typically been to remove the rinsing solution and replace it with a liquid that leaves fewer residue markings on the semiconductor wafer. However, in the process of displacement of the rinsing solution, forces similar in magnitude to the surface tension forces associated with drying of rinsing solutions may be applied to the photoresist patterns.

A method is needed to reduce rinsing fluid surface tension to reduce shear stresses imposed on high aspect ratio photoresist features as the fluid dries and thereby minimize toppling of high aspect ratio photoresist features.

BRIEF SUMMARY OF THE INVENTION

One exemplary embodiment of an apparatus of the present invention is configured for cleaning and drying a semiconductor wafer. A spin chuck configured for supporting and constraining movement of a semiconductor wafer is disposed within a sealable chamber. The semiconductor wafer may be spun at various speeds and of various durations on the spin chuck during the cleaning, rinsing, and drying operations associated with removal of developer solution from the semiconductor wafer. A rinsing solution dispenser is located and oriented to dispose a rinsing solution onto the semiconductor wafer mounted on the spin chuck. Disposition of the rinsing solution may occur while the semiconductor wafer is stationary followed by spinning, or the rinsing solution may be disposed on the semiconductor wafer while it is spinning. A device for introducing a vapor ambient of a drying composition into the sealable chamber is also provided.

In one embodiment, the device for introducing the vapor ambient may be comprised of a vaporizer, which introduces a surface tension modifying fluid into the sealable chamber in a vapor, or mist, form. The vapor ambient may be created by a structure for introducing an inert gas into the sealable chamber in combination with a vaporized surface tension modifying fluid to create the overall vapor ambient. The vapor ambient and condensation of the surface tension modifying fluid onto the rinsing solution may be controlled by pressure or flow adjustments through the structure for introducing the inert gas or through a separate ambient pressure regulator. A temperature regulator may also be used to adjust the temperature of the vapor ambient within the sealable chamber. If required, or desired, a device for disposing a cleaning fluid onto the surface of the semiconductor wafer prior to rinsing may also be provided.

Another exemplary embodiment of the present invention comprises a method for cleaning and drying a semiconductor wafer. In this method, the semiconductor wafer is spun. A cleaning fluid is applied to the top, or active, surface of the semiconductor wafer to clean off any excess photoresist remaining after exposure and development. A rinsing solution is applied to thoroughly rinse the semiconductor wafer of any remaining impurities. To reduce stresses caused by surface tension of the rinsing solution, which may cause toppling of resist features on the semiconductor wafer, the semiconductor wafer is dried in a vapor ambient created by introducing an inert gas and a surface tension modifying fluid in a vapor state over the active surface of the semiconductor wafer. The vapor ambient produces a surface shear reduction effect to reduce the surface tension of the rinsing solution.

In a variation of the method of the present invention, the semiconductor wafer enters the treatment environment already cleaned of surplus photoresist. Only rinsing and drying acts as described above are performed while the semiconductor wafer is spun for one or more selected durations and spin rates.

BRIEF DESCRIPTION OF THE DRAWINGS

In the drawings, which illustrate what is currently considered to be the best mode for carrying out the invention.

DETAILED DESCRIPTION OF THE INVENTION

Figure 1:
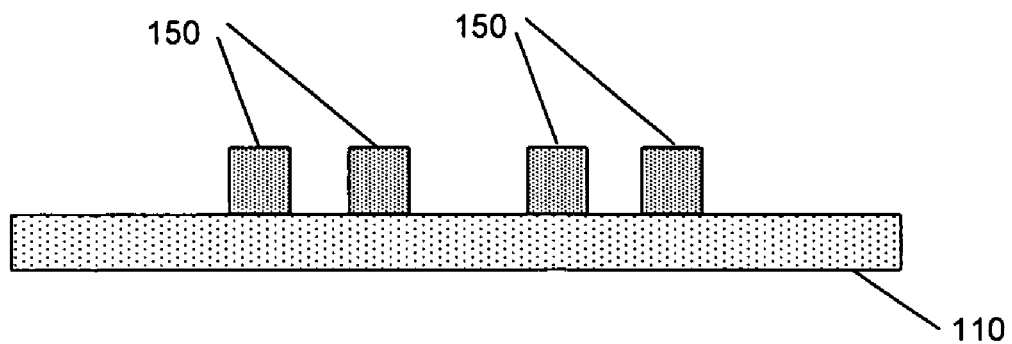
FIG. 1 is a cross-sectional view of a portion of a semiconductor wafer showing conventional photoresist features after exposure and development and exhibiting a relatively low aspect ratio.
Figure 2:
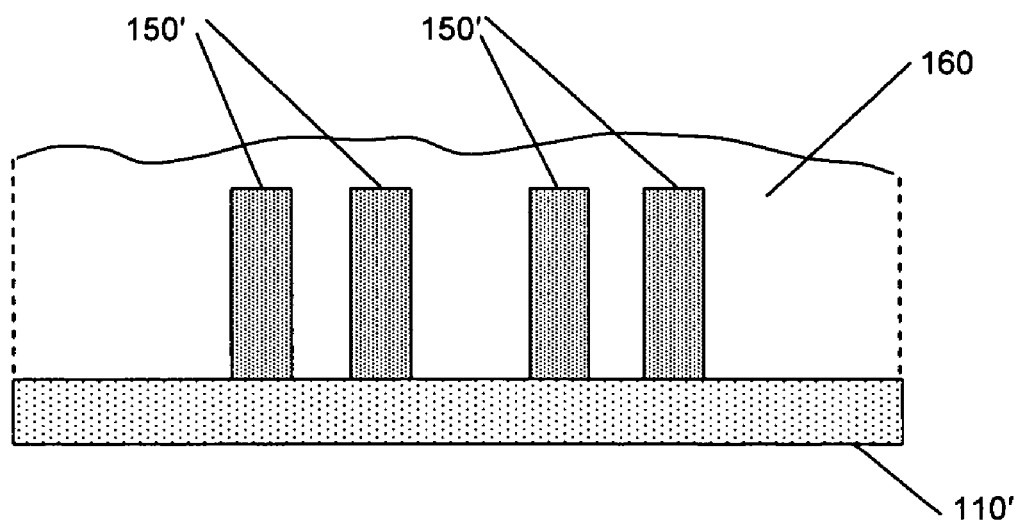
FIG. 2 is a cross-sectional view of a portion of a semiconductor wafer showing photoresist features as produced using newer, conventional photolithographic process technologies and exhibiting a relatively high aspect ratio, the features being covered with a rinsing fluid.
Figure 3:
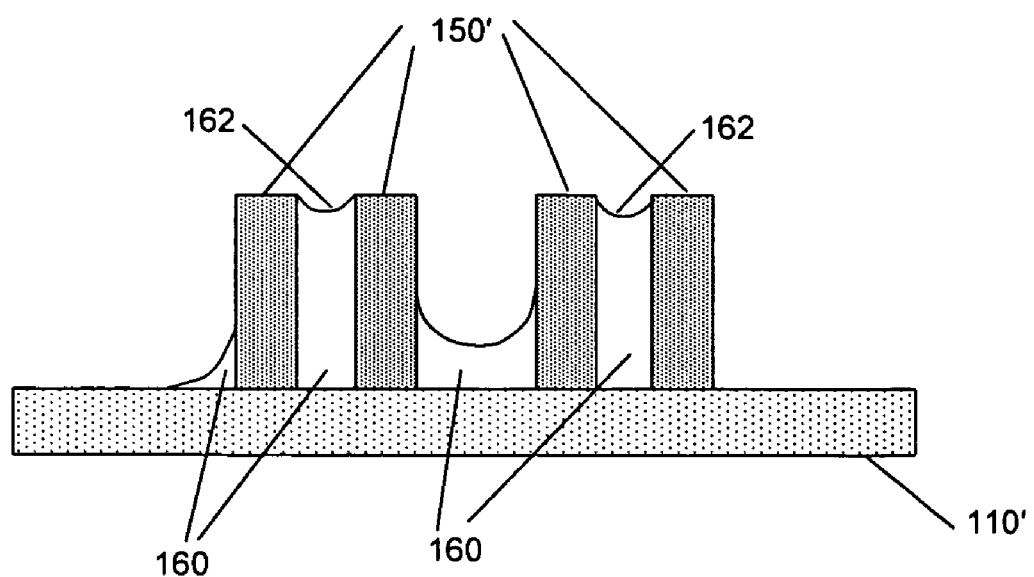
FIG. 3 is a cross-sectional view of a portion of the semiconductor wafer depicted in FIG. 2, showing menisci that form adjacent to the photoresist features as the rinsing fluid dries.
Figure 3A:
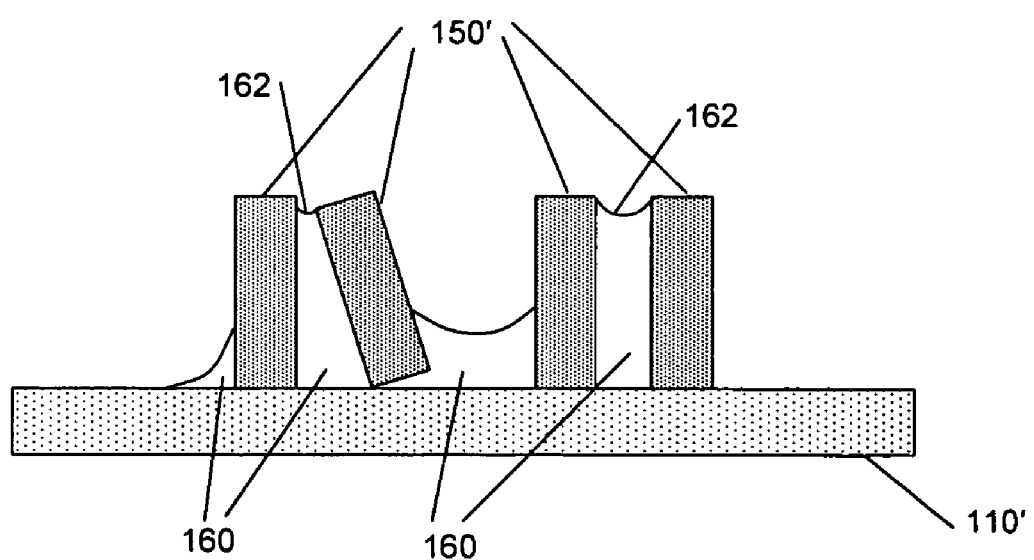
FIG. 3A is a cross-sectional view of the portion of the semiconductor wafer depicted in FIG. 3, showing toppling of a photoresist feature due to surface tension of the menisci of drying rinsing fluid.

FIG. 1 depicts a semiconductor wafer 110 with an exemplary pattern of photoresist features 150 formed on the active surface thereof. While not to scale, FIG. 1 is intended to show the relatively low aspect ratio, defined as the ratio of the height of a photoresist feature relative to the width of the photoresist feature, of photoresist features produced by conventional photolithographic technologies associated with the larger-width feature sizes. As feature size of semiconductor devices shrinks with the development of new design and fabrication technologies, the aspect ratio of the photoresist features necessarily increases, as shown in FIG. 2, because the thickness of the applied photoresist cannot be reduced proportionally to the reduced feature width. Again, FIG. 2 is not necessarily to scale but is intended to show "tall," relatively high aspect ratio photoresist features 150' exhibiting enhanced susceptibility to toppling from stresses placed thereon. FIG. 2 also shows a semiconductor wafer 110' and high aspect ratio photoresist features 150' covered with a rinsing solution 160. As the rinsing solution 160 dries, as shown in FIG. 3, the surface tension of the rinsing solution 160 causes menisci 162 to form on areas on the semiconductor wafer 110' and between the high aspect ratio photoresist features 150'. Drying of the rinsing solution 160 causes the menisci 162 bridging between adjacent photoresist features 150' to pull those features toward one another. The surface tension exerted by a meniscus 162 at the top of a photoresist feature 150', shown as adjacent lines in FIGS. 2, 3 and 3A, creates a much longer moment arm acting on the features due to the increased distance between tops and bottoms of photoresist features 150' attributable to the high aspect ratio thereof. Because of the longer moment arm, the torque applied on a high aspect ratio photoresist feature 150' and thus the shear stress applied at the base thereof adjacent its interface with semiconductor wafer 110' is enhanced. The increased torque may cause one or more of the high aspect ratio photoresist features 150' being pulled toward one another as rinsing solution 160 dries to break at or near their bases on semiconductor wafer 110', causing toppling as depicted in FIG. 3A. A toppled photoresist feature 150' may cover a portion of the underlying semiconductor wafer 110', thus preventing exposure of that portion to subsequent process steps and potentially causing exposure of an area on semiconductor wafer 110' sought to be protected. Additionally, a broken-off high aspect ratio photoresist feature 150' may release completely from semiconductor wafer 110' and float to another area of the semiconductor wafer 110', causing additional process defects in the location where it comes to rest. The present invention reduces the surface tension of a rinsing solution acting on photoresist features to reduce the torque-induced stress thereon. While the present invention may be more effective for structures with a high aspect ratio, it is equally applicable to low aspect ratio structures such as those shown in FIG. 1.

Figure 4:
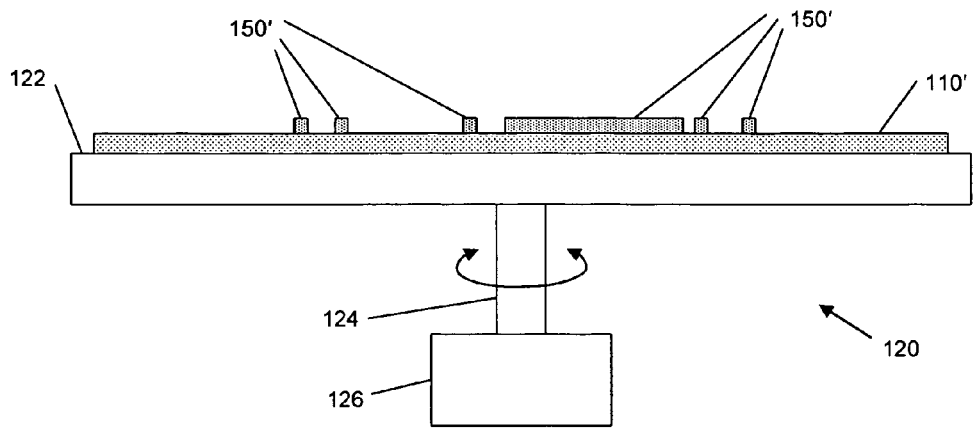
FIG. 4 is a cross-sectional view of a rotatable spin chuck assembly suitable for holding and supporting a semiconductor wafer in the practice of the present invention.

FIG. 4 depicts the semiconductor wafer 110' including photoresist features 150' on the active surface thereof. The semiconductor wafer 110 is mounted on a spin chuck assembly 120. The spin chuck assembly 120 includes a mounting plate 122 for holding the semiconductor wafer 110', which is in turn rotationally driven by a spindle 124 attached to the mounting plate 122, as known to those of ordinary skill in the art. The mounting plate 122 is rotated about a vertical axis by a drive mechanism such as a variable-speed electric motor 126, again as known to those of ordinary skill in the art. The mounting plate 122 may be rotated at a variety of desired speeds and for selected durations before, after, during, and intermittently during the cleaning, rinsing, and drying processes. Applying a cleaning fluid and a rinsing solution to the semiconductor wafer 110' while spinning on the mounting plate 122, then enhancing the drying process by continuing to spin the semiconductor wafer 110', are well-known techniques.

Figure 5:
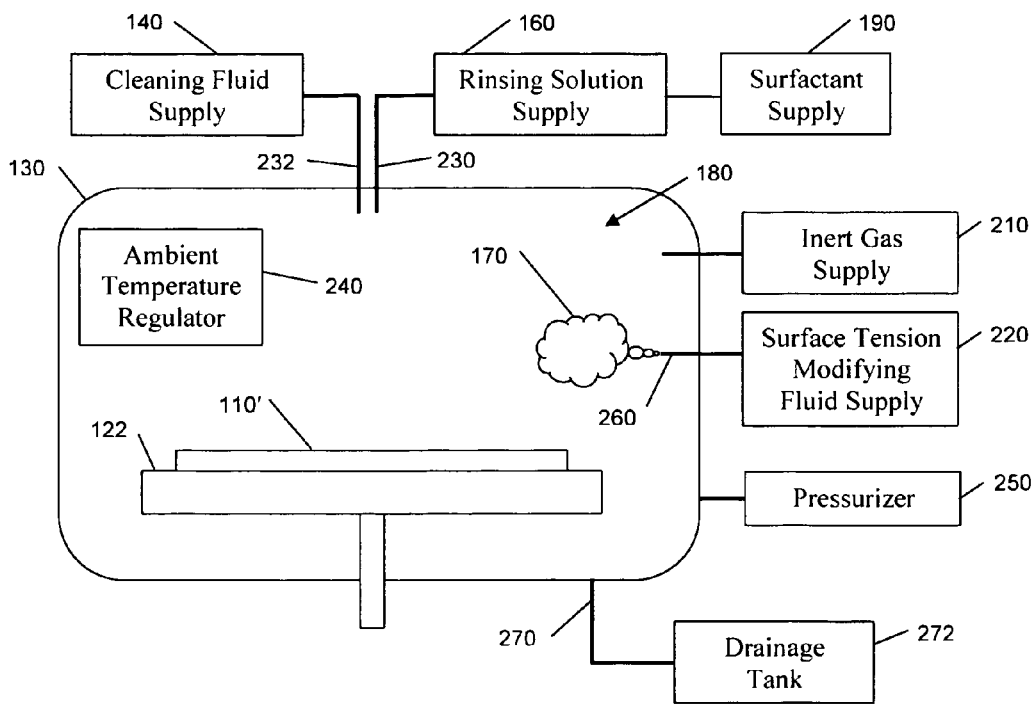
FIG. 5 is a schematic representation of a semiconductor wafer cleaning and drying apparatus in accordance with the present invention.

FIG. 5 depicts an exemplary apparatus for practicing the present invention. Note that FIG. 5 is a schematic representation and does not necessarily represent a specific physical configuration for the apparatus or locations of the various features and elements. FIG. 5 shows the semiconductor wafer 110' mounted on the mounting plate 122 of spin chuck assembly 120 (FIG. 4) inside a sealable chamber 130. The sealable chamber 130 enables a controlled drying environment. If the developed photoresist has not been thoroughly removed prior to placement of the semiconductor wafer 110' in the sealable chamber 130, a cleaning fluid from cleaning fluid supply 140 may be applied to the active surface of the semiconductor wafer 110'. Typically, the cleaning fluid is applied to the surface of the spinning semiconductor wafer 110' through a cleaning fluid dispenser 232 positioned with an outlet, such as a nozzle, within sealable chamber 130 for deposition of the cleaning fluid onto semiconductor wafer 110' as mounted on spin chuck assembly 120. The types of cleaning fluids used are well known in the art, but the specific cleaning fluid employed is highly dependent on what type of photoresist and developer are used. Exemplary cleaning fluids include hydrofluoric acid, ammonium hydroxide, or a mixture of hydrogen peroxide and sulfuric acid. Also, spin rate and duration applied to semiconductor wafer 110' during cleaning may vary depending on type of photoresist and developer as well as the semiconductor device architecture and photoresist feature densities on the semiconductor wafer 110'. The cleaning fluid may be applied prior to commencement of spinning, during spinning, or both, and the cleaning fluid application and spinning sequence may be repeated as needed for thorough cleaning.

Rinsing may be performed once the semiconductor wafer 110' is placed in the sealable chamber 130 or rinsing may follow cleaning within the sealable chamber 130. Within the sealable chamber 130, a rinsing solution from rinsing solution supply 160 may be applied to the surface of the semiconductor wafer 110' through a rinsing solution dispenser 230 having an outlet, such as a nozzle, positioned within sealable chamber 130. The rinsing solution may be applied prior to starting the wafer spinning, during wafer spinning, or both. Rinsing solution application and spinning may be repeated as needed to effect a thorough rinsing. In addition, the spin rate and duration for rinsing may vary depending on type of photoresist, developer, and cleaning fluid that are used. Spin rate and duration may also be dependent upon the semiconductor architecture and photoresist feature densities on the semiconductor wafer 110'. Optionally, if the developed photoresist has not been adequately removed prior to placement of the semiconductor wafer 110' in the sealable chamber 130, additional cleaning processes may be performed to remove the remaining photoresist prior to rinsing and drying of the wafer.

One typical rinsing solution is de-ionized (DI) water. However, the DI water may be combined with other rinsing and cleaning agents. Also, rinsing solutions other than DI water are possible. Optionally, a surfactant from surfactant supply 190 may be mixed with the rinsing solution to create a resultant rinsing mixture with reduced overall surface tension. However, generally the concentration of surfactant should be maintained at a relatively low level to prevent residue development or etching, as explained above. There is a large class of short chain and long chain surfactants available and suitable for embodiments of the present invention. At least some of the suitable surfactants include Optiyield-22 surfactant, OPTIMAX™ surfactant, and the Surfinol class of surfactants, such as Surfinol 465 and Surfinol 440. Selection of an appropriate surfactant is dependent upon many factors such as the type of rinsing solution, the desired drying time, the degree of etching that is tolerable, and the type of surface tension modifying fluid to be used. Use of a surface tension modifying fluid in accordance with the present invention is explained below.

Once the rinsing solution has been applied and the semiconductor wafer 110' is sufficiently rinsed of all impurities, a drying process may be commenced. The drying process takes advantage of a surface shear reduction effect, such as, for example, a Marangoni effect, to reduce surface tension and thereby reduce the forces that cause photoresist toppling. For example, when DI water, or a rinsing solution with properties similar to DI water, is used as a rinsing solution, a hydrophilic substance such as isopropyl alcohol (IPA), acts as a suitable surface tension modifying fluid for the surface shear reduction effect. IPA has a lower surface tension than that of DI water and, therefore, is attracted by the surface of the DI water by the surface shear reduction effect. As mentioned earlier, this is a different application of the surface shear reduction effect than is known in the art. Generally, and as noted above, the surface shear reduction effect has been used conventionally to displace a rinsing solution on the semiconductor wafer to create a new drying composition on a semiconductor wafer that is less likely to leave residue on the semiconductor wafer as the surface tension modifying fluid dries.

In an exemplary embodiment of the drying process, a drying composition 180 is introduced into the sealable chamber 130. This drying composition 180 is formed of a surface tension modifying fluid supply 220, which is vaporized as it is introduced to the sealable chamber 130 through a vaporizer 260, in combination with an inert gas from inert gas supply 210 introduced into the sealable chamber 130 before or during introduction of the vaporized surface tension modifying fluid supply 220. The concentration of the drying composition 180 may be adjusted to best promote the surface shear reduction effect. The vaporized drying composition 180 forms a vapor ambient 170. Some of the vapor settles on the surface of the rinsing solution on semiconductor wafer 110' and creates a thin film of surface tension modifying fluid, which is adsorbed by, and partially diffuses into, the rinsing solution. Since the surface tension of the surface tension modifying fluid is less than that of the rinsing solution, the surface tension exerted on the photoresist features 150' (FIGS. 2, 3, 3A and 4) is reduced due to the lower surface tension of the film of surface tension modifying fluid that forms on top of the rinsing solution as well as the lowered surface tension of the rinsing solution caused by diffusion of the surface tension modifying fluid therein. This reduction in surface tension results in less stress on the photoresist features 150', consequently reducing the likelihood of toppling.

The composition and concentration of vapor ambient 170 may be controlled by many factors. The amount of surface tension modifying fluid introduced into the sealable chamber 130 relative to the volume of inert gas affects the concentration of the drying composition 180. Pressure within the sealable chamber 130 may be raised or lowered to affect the vapor ambient 170 and the rate at which the surface tension modifying fluid supply 220 will condense, adsorb, and diffuse onto the rinsing solution. Similarly, modifying the temperature of the vapor ambient 170 will affect condensation, adsorption, and diffusion propensities. Temperature, pressure, and concentration of surface tension modifying fluid relative to inert gas may be monitored and modified to produce the desired effect. For example, when using DI water as the rinsing solution and IPA as the surface tension modifying fluid, if the temperature of the DI water is sufficiently low relative to the temperature and pressure of the IPA vapor, condensation of the IPA vapor onto the surface of the DI water is promoted, tending to create a film of IPA on top of the DI water. On the other hand, if the temperature of the DI water is higher than the boiling point of the IPA, the WA vapor that contacts the DI water is absorbed into the DI water and will begin diffusing into the DI water. The boiling point of the IPA may be controlled by a combination of both the temperature and pressure of the vapor ambient 170.

Temperature may be controlled with an ambient temperature regulator 240 comprising, for example, heating units, cooling units, and temperature monitors, to heat or cool the vapor ambient 170 within the sealable chamber 130 to a desired temperature. Pressure within sealable chamber 130 may be controlled by the controlled introduction of the inert gas into the sealable chamber 130. Alternatively, a separate ambient pressure regulator 250 comprising, for example, a pump and valve assembly, may be used to create a desired pressure change relative to ambient air pressure outside the sealable chamber 130.

While IPA has been used as an example of a surface tension modifying fluid, other compositions are within the scope of the invention. For example, a different surface tension modifying fluid would likely be desired if a rinsing solution other than DI water were used. Alternatively, possibly, the selection of surfactant may create the need for a different surface tension modifying fluid, or vice versa. Some suitable surface tension modifying fluids may be similar to the suitable surfactants and include Optiyield-22 surfactant, OPTIMAX™ surfactant, and the Surfinol class of surfactants, such as Surfinol 465 and Surfinol 440. In addition, the type of inert gas may be varied. Some suitable examples of inert gases include nitrogen, argon, krypton, and helium.

Finally, a drain 270 may be included as part of the apparatus to remove excess cleaning fluid, rinsing solution, and surface tension modifying fluid from the sealable chamber 130 into drainage tank 272 for recycling or other disposition.

Although the present invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A photoresist cleaning and drying method, comprising:
  applying a cleaning fluid to a surface of a semiconductor wafer bearing a developed pattern of photoresist features thereon to remove surplus photoresist from the pattern;
  applying a rinsing solution to the surface of the semiconductor wafer to remove the cleaning fluid; and
  reducing torque, shear stress, or a combination thereof on the photoresist features by introducing a vapor ambient of a drying composition adjacent the surface of the semiconductor wafer to reduce surface tension of the rinsing solution as it dries.

2. The method of claim 1, further comprising spinning the semiconductor wafer for a period of time relative to the applying the cleaning fluid, wherein the relative period of time is selected from the group consisting of before, after, during, and intermittently during application of the cleaning fluid.

3. The method of claim 1, further comprising spinning the semiconductor wafer for a period of time relative to the applying the rinsing solution, wherein the relative period of time is selected from the group consisting of before, after, during, and intermittently during application of the rinsing solution.

4. The method of claim 1, further comprising spinning the semiconductor wafer for a period of time relative to the introducing the vapor ambient, wherein the relative period of time is selected from the group consisting of before, after, during, and intermittently during application of the vapor ambient.

5. The method of claim 1, wherein introducing the vapor ambient further comprises combining an inert gas and a vaporized surface tension modifying fluid to form the drying composition.

6. The method of claim 5, further comprising adjusting a temperature of the vapor ambient adjacent the surface of the semiconductor wafer to promote reduced surface tension.

7. The method of claim 5, further comprising adjusting a pressure of the vapor ambient adjacent the surface of the semiconductor wafer to promote reduced surface tension.

8. The method of claim 5, further comprising adjusting a spin rate of the semiconductor wafer to promote reduced surface tension.

9. The method of claim 5, further comprising selecting the surface tension modifying fluid from the group consisting of Optiyield-22, Surfinol 465, and Surfinol 440.

10. The method of claim 5, further comprising selecting the inert gas from the group consisting of nitrogen, argon, krypton, and helium.

11. The method of claim 1, further comprising using de-ionized water as at least a component of the rinsing solution.

12. The method of claim 1, wherein applying the rinsing solution further comprises introducing a surfactant into the rinsing solution prior to applying the rinsing solution.

13. The method of claim 12, further comprising selecting the surfactant from the group consisting of Optiyield-22, Surfinol 465, and Surfinol 440.

14. The method of claim 1, further comprising selecting the cleaning fluid from the group consisting of, hydrofluoric acid, ammonium hydroxide, and a mixture of hydrogen peroxide and sulfuric acid.

15. A drying method, comprising:
  rinsing a surface of a semiconductor wafer bearing a developed pattern of photoresist features thereon by applying a rinsing solution to the surface to remove a cleaning fluid used to remove surplus photoresist from the surface; and
  reducing torque, shear stress, or a combination thereof on the photoresist features by reducing surface tension of the rinsing solution as it dries by introducing a vapor ambient of a drying composition adjacent the surface.

16. The method of claim 15, further comprising spinning the semiconductor wafer for a period of time relative to the introducing the vapor ambient, wherein the relative period of time is selected from the group consisting of before, after, during, and intermittently during application of the vapor ambient.

17. The method of claim 15, further comprising adjusting an environmental parameter of the vapor ambient to promote reduced surface tension, the environmental parameter selected from the group consisting of a temperature of the vapor ambient and a pressure of the vapor ambient.

18. The method of claim 15, wherein reducing surface tension further comprises combining an inert gas and a vaporized surface tension modifying fluid to form the drying composition.

19. The method of claim 18, further comprising selecting the surface tension modifying fluid from the group consisting of Optiyield-22, Surfinol 465, and Surfinol 440.

20. The method of claim 18, further comprising selecting the inert gas from the group consisting of nitrogen, argon, krypton, and helium.

* * * * *